United States Patent
Cheng et al.

(10) Patent No.: US 11,907,437 B2
(45) Date of Patent: Feb. 20, 2024

(54) TERMINAL CONTROL SYSTEM AND METHOD, AND TERMINAL DEVICE

(71) Applicant: SHANGHAI AWINIC TECHNOLOGY CO., LTD, Shanghai (CN)

(72) Inventors: Tao Cheng, Shanghai (CN); Zhong Zhang, Shanghai (CN); Jiantao Cheng, Shanghai (CN); Liming Du, Shanghai (CN); Hongjun Sun, Shanghai (CN)

(73) Assignee: SHANGHAI AWINIC TECHNOLOGY CO., LTD., Shanghai (CN)

( * ) Notice: Subject to any disclaimer, the term of this patent is extended or adjusted under 35 U.S.C. 154(b) by 226 days.

(21) Appl. No.: 17/595,403

(22) PCT Filed: May 14, 2020

(86) PCT No.: PCT/CN2020/090118
§ 371 (c)(1),
(2) Date: Nov. 16, 2021

(87) PCT Pub. No.: WO2020/228752
PCT Pub. Date: Nov. 19, 2020

(65) Prior Publication Data
US 2022/0197401 A1  Jun. 23, 2022

(30) Foreign Application Priority Data
May 16, 2019 (CN) .......................... 201910405868.2

(51) Int. Cl.
G06F 3/041  (2006.01)
G06F 3/02   (2006.01)
G06F 3/023  (2006.01)
G06F 3/0346 (2013.01)
H04M 1/23   (2006.01)

(52) U.S. Cl.
CPC ............ *G06F 3/0202* (2013.01); *G06F 3/023* (2013.01); *G06F 3/0346* (2013.01); *H04M 1/236* (2013.01)

(58) Field of Classification Search
None
See application file for complete search history.

(56) References Cited

U.S. PATENT DOCUMENTS

2006/0238517 A1  10/2006  King et al.
2010/0084542 A1   4/2010  Chou
(Continued)

FOREIGN PATENT DOCUMENTS

CN  104423740 A  3/2015
CN  104866147 A  8/2015
(Continued)

OTHER PUBLICATIONS

International Search Report dated Jun. 30, 2020; PCT/CN2020/090118.
(Continued)

*Primary Examiner* — Carl Adams
(74) *Attorney, Agent, or Firm* — Emerson, Thomson & Bennett, LLC; Roger D. Emerson; Jarrett Wyatt

(57) ABSTRACT

A terminal control system and method, and a terminal device are provided. The terminal control system includes: a detection chip and at least one terminal key arranged on a side surface of a terminal device. The detection chip is connected to the terminal key. The terminal key is configured to generate an inductive capacitance and an interelectrode capacitance corresponding to an external control instruction, in response to a reception of the external control instruction. The detection chip is configured to detect the inductive capacitance and the interelectrode capacitance; determine inductive capacitance variation corresponding to the induc- (Continued)

tive capacitance and interelectrode capacitance variation corresponding to the interelectrode capacitance; determine a control type corresponding to the control instruction according to the inductive capacitance variation and the interelectrode capacitance variation; and trigger the terminal device to perform a control operation corresponding to the control type.

15 Claims, 4 Drawing Sheets

(56) References Cited

U.S. PATENT DOCUMENTS

| | | | |
|---|---|---|---|
| 2012/0062463 A1* | 3/2012 | Wu | G06F 3/044 345/173 |
| 2015/0062068 A1 | 3/2015 | Shih et al. | |
| 2016/0195980 A1 | 7/2016 | Liao et al. | |
| 2017/0060340 A1* | 3/2017 | Chen | G06F 3/0447 |
| 2017/0308240 A1 | 10/2017 | Yeh et al. | |

FOREIGN PATENT DOCUMENTS

| | | |
|---|---|---|
| CN | 106020558 A | 10/2016 |
| CN | 107305451 A | 10/2017 |
| CN | 109710150 A | 5/2019 |
| CN | 110134254 A | 8/2019 |

OTHER PUBLICATIONS

The Extended European Search Report dated Jan. 2, 2023; Appln. No. 20805554.1.

* cited by examiner

TERMINAL CONTROL SYSTEM AND METHOD, AND TERMINAL DEVICE

This application is a national stage of International Application No. PCT/CN2020/090118, filed on May 14, 2020, which claims priority to Chinese Patent Application No. 201910405868.2, titled "TERMINAL CONTROL SYSTEM AND METHOD, AND TERMINAL DEVICE", filed on May 16, 2019 with the China National Intellectual Property Administration, both of which are incorporated herein by reference in their entireties.

TECHNICAL FIELD

The present disclosure relates to the technical field of intelligent terminal, and particularly, to a terminal control system and control method, and a terminal device.

BACKGROUND

With rapid development of science and technology, smart phones are widely used in people's daily life. The smart phones are used for various entertainment activities, such as listening to music and playing games. Especially mobile phone keys in the smart phones are used to realize some simple operations of the terminal devices. For example, when listening to music on a smart phone, a user can adjust volume of the music, or switch or pause the music through a side key set on the smart phone, so that the user can use the smart phone more conveniently.

In a research process of various function keys of various smart phones, it is found that when the user listens to music or uses the smart phone to perform other application, the user may press the key of the phone due to an external mechanical collision, for example, the user accidentally bumps the key of the smart phone into a corner of a desk. In this case, a corresponding function may be executed, which will cause misoperation of the smart phone and reduce user experience.

SUMMARY

A technical problem to be solved by the present disclosure is to provide a terminal control system. In this way, when a key of the terminal receives an external control instruction, the terminal will not perform misoperations due to a mechanical touch, thereby improving user experience.

A terminal control method is further provided by the present disclosure to ensure implementation and application of the above system in practice.

A terminal control system includes:

a detection chip, and at least one terminal key arranged on a side of a terminal device; where the detection chip is connected to each of the at least one terminal key;

each of the at least one terminal key is configured to generate an inductive capacitance and an interelectrode capacitance corresponding to an external control instruction, in response to a reception of the control instruction; and the detection chip is configured to detect the inductive capacitance and the interelectrode capacitance; determine inductive capacitance variation corresponding to the inductive capacitance and interelectrode capacitance variation corresponding to the interelectrode capacitance; determine a control type corresponding to the control instruction according to the inductive capacitance variation and the interelectrode capacitance variation; and trigger the terminal device to perform a control operation corresponding to the control type.

In an embodiment, in the above terminal control system, the terminal key includes:

a key shell, a capacitive sensing layer, a buffer layer and a substrate which are arranged in sequence;

the key shell is configured to protect the capacitive sensing layer, the buffer layer and the substrate;

one end of the capacitive sensing layer is connected to system ground to form a ground capacitor to the system ground, and the capacitive sensing layer is configured to generate the inductive capacitance corresponding to the control instruction, in response to a reception of the control instruction by the terminal key;

the buffer layer is configured to form an interelectrode gap between the capacitive sensing layer and the substrate; and form a deformation in response to a reception of the control instruction by the capacitive sensing layer, to generate interelectrode gap variation corresponding to the deformation; and the substrate is configured to form an interelectrode capacitor with the capacitance sensing layer, and generate the interelectrode capacitance corresponding to the control instruction after the buffer layer forms the deformation.

In an embodiment, in the above terminal control system, the detection chip includes:

a first detection module, a second detection module, and a trigger module;

the first detection module is connected to the capacitance sensing layer;

the second detection module is connected to the capacitance sensing layer and the substrate respectively;

the trigger module is connected to the first detection module and the second detection module respectively;

the first detection module is configured to detect the ground capacitor of the capacitance sensing layer, detect the inductive capacitance variation corresponding to the inductive capacitance in response to a generation of the inductive capacitance by the capacitance sensing layer, and determine whether the inductive capacitance variation is greater than a preset first threshold;

the second detection module is configured to detect the interelectrode capacitor between the capacitance sensing layer and the substrate; in a case that the interelectrode capacitance greater than an initial capacitance is generated between the capacitance sensing layer and the substrate, detect the interelectrode capacitance variation corresponding to the interelectrode capacitance; and determine whether the interelectrode capacitance variation is greater than a preset second threshold; and the trigger module is configured to in a case that the inductive capacitance variation is greater than the preset first threshold and the interelectrode capacitance variation is greater than the preset second threshold, determine that the control type corresponding to the control instruction is a user pressing control, and trigger the terminal device to perform a pressing control operation corresponding to the user pressing control; in a case that the inductive capacitance variation is not greater than the first threshold and the interelectrode capacitance variation is greater than the second threshold, determine that the control type corresponding to the control instruction is a mechanical pressing control, and no trigger the terminal device to perform any control operation; in a case that the inductive capacitance variation is greater than the first threshold and the interelectrode capacitance variation is not greater than the second threshold, determine that the control type corresponding to the control instruction is a user touch control, and trigger the terminal device to perform a touch control operation corresponding to the user touch control; and in a case that the inductive capacitance variation is not greater than the first threshold and the interelectrode capacitance variation is not greater than the second threshold, determine that the control type corresponding to the control instruction is a mechanical touch control, and no trigger the terminal device to perform any control operation.

In an embodiment, in the above terminal control system for, the system further includes:

an orientation sensor;

where the orientation sensor is connected to the detection chip; and the orientation sensor is configured to sense a screen orientation of the terminal device, and send an orientation changing instruction to the detection chip in response to a change of the screen orientation of the terminal device, where the detection chip switches a key function of the terminal key corresponding to the control operation according to the orientation changing instruction.

In an embodiment, in the above terminal control system, the key shell of the terminal key is arranged on a side surface of the terminal control system;

the capacitance sensing layer, the buffer layer and the substrate of the terminal key are arranged inside the terminal control system; and each key shell is arranged on the side surface of the terminal control system according to a preset arrangement.

In an embodiment, in the above terminal control system, the capacitive sensing layer has a single strip structure, or a sliding strip structure containing at least two channels.

In an embodiment, in the above terminal control system, the second detection module is further configured to:

detect a variation of a pressure value sustained by the terminal device in response to a reception of the control instruction by the terminal key, to determine whether the control instruction is a pressing control based on the variation of the pressure value, wherein the pressing control includes the user pressing control and the mechanical pressing control.

A terminal control method includes:

detecting an inductive capacitance and an interelectrode capacitance which correspond to a control instruction and are generated by a preset terminal key, in response to a reception of the control instruction;

determining inductive capacitance variation corresponding to the inductive capacitance and interelectrode capacitance variation corresponding to the interelectrode capacitance based on the inductive capacitance and the interelectrode capacitance; and determining a control type corresponding to the control instruction according to the inductive capacitance variation and the interelectrode capacitance variation, and triggering the terminal device to perform a control operation corresponding to the control type.

In an embodiment, in the above terminal control method, the determining the control type corresponding to the control instruction according to the inductive capacitance variation and the interelectrode capacitance variation, and triggering the terminal device to perform the control operation corresponding to the control type includes:

determining whether the inductive capacitance variation is greater than a preset first threshold;

determining that the control type corresponding to the control instruction is a user control and triggering the terminal device to perform a control operation corresponding to the user control, in a case that the inductive capacitance variation is greater than the first threshold; and determining that the control type corresponding to the control instruction is a mechanical control and no triggering the terminal device to perform any control operation, in a case that the inductive capacitance variation is not greater than the first threshold.

In an embodiment, in the above terminal control method, the determining that the control type corresponding to the control instruction is user control, and triggering the terminal device to perform the control operation corresponding to the user control, in a case that the inductive capacitance variation is greater than the first threshold includes:

detecting whether the interelectrode capacitance variation is greater than a preset second threshold, in the case that the inductive capacitance variation is greater than the first threshold;

determining that the user control is a user pressing control and triggering the terminal device to perform a pressing control operation corresponding to the user pressing control, in a case that the interelectrode capacitance variation is greater than the second threshold; and determining that the user control is a user touch control and triggering the terminal device to perform a touch control operation corresponding to the user touch control, in a case that the interelectrode capacitance variation is not greater than the second threshold.

In an embodiment, in the above terminal control method, the determining that the control type corresponding to the control instruction is a mechanical control and no triggering the terminal device to perform any control operation, in a case that the inductive capacitance variation is not greater than the first threshold includes:

detecting whether the interelectrode capacitance variation is greater than a preset second threshold, in the case that the inductive capacitance variation is not greater than the first threshold;

determining that the mechanical control is mechanical pressing control and no triggering the terminal device to perform any control operation, in a case that the interelectrode capacitance variation is greater than the second threshold; and determining that the mechanical control is mechanical touch control and no trigging the terminal device to perform any control operation, in a case that the interelectrode capacitance variation is not greater than the second threshold.

In an embodiment, the above terminal control method further includes:

switching a key function of the terminal key corresponding to the control operation according to an orientation changing instruction, in response to a reception of the orientation changing instruction sent by a preset orientation sensor; and triggering the terminal device to perform a control operation corresponding to the key function, in a case that it is determined that the control type corresponding to the control instruction and received by the terminal key is the user control.

A terminal device includes the above terminal control system.

A terminal device includes a detection chip, and the detection chip is configured to execute the above terminal control method.

In an embodiment, the above terminal device is a smart phone.

Compared with the conventional technology, beneficial effects achieved by the present disclosure are as follows.

The terminal control system according to the present disclosure includes a detection chip and at least one terminal key arranged on a side of the terminal device. The detection chip is connected to the terminal key; the terminal key is configured to generate an inductive capacitance and an interelectrode capacitance corresponding to an external control instruction, in response to a reception of the control instruction; and the detection chip is configured to detect the inductive capacitance and the interelectrode capacitance, and determine inductive capacitance variation corresponding to the inductive capacitance and interelectrode capacitance variation corresponding to the interelectrode capacitance, determine a control type corresponding to the control instruction according to the inductive capacitance variation and the interelectrode capacitance variation, and trigger the terminal device to perform a control operation corresponding to the control type. By applying the system provided by the present disclosure, the detection chip detects the inductive capacitance and the interelectrode capacitance in the terminal key, and determines whether the control type of the control instruction received by the terminal key is a mechanical control operation, thereby preventing the misoperation of the terminal device due to the mechanical control, and improving the user experience.

BRIEF DESCRIPTION OF THE DRAWINGS

In order to more clearly explain the embodiments of the present invention or the technical solutions in the prior art, the drawings used in the description of the embodiments or the prior art will be briefly introduced below. Obviously, the drawings in the following description are merely an embodiment of the present invention. For those of ordinary skill in the art, other drawings can be obtained according to the provided drawings without paying creative labor.

DETAILED DESCRIPTION

The technical solution according to the embodiments of the present application will be described clearly and completely as follows in conjunction with the accompany drawings in the embodiments of the present application. It is obvious that the described embodiments are only a part of the embodiments according to the present application, rather than all of the embodiments. All the other embodiments obtained by those skilled in the art based on the embodiments in the present application without any creative work belong to the scope of protection of the present application.

The terms "first", "second" and the like in the present disclosure are used to distinguish one entity or operation from another entity or operation, and do not necessarily require or imply any such actual relationship or order between these entities or operations. The terms "include", "comprise" or any other variations are intended to cover non-exclusive "include", thus a process, a method, an object or a device including a series of factors not only include the listed factors, but also include other factors not explicitly listed, or also include inherent factors of the process, the method, the object or the device. Without more limitations, a factor defined by a sentence "include one . . . " does not exclude a case that there is another same factor in the process, the method, the object or the device including the described factor.

The present disclosure can be applied in many general-purpose or special-purpose computing device environments or configurations, such as, a personal computer, a server computer, a handheld or portable device, a tablet device, a multi-processor device, and a distributed computing environment including any of the above devices or equipment.

Figure 1:
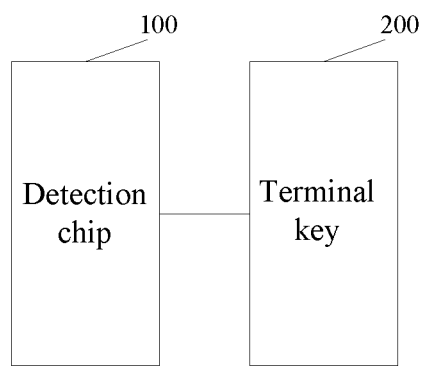
FIG. 1 is a system structure diagram of a terminal control system according to an embodiment of the present disclosure.

A terminal control system is provided according to an embodiment of the present disclosure. The system can be applied to many devices or equipment with terminal keys. A system structure diagram of the system is illustrated in FIG. 1, which specifically includes:

a detection chip 100 and at least one terminal key 200 arranged on a side of a terminal device.

The detection chip is connected to each terminal key.

Each terminal key is configured to generate an inductive capacitance and an interelectrode capacitance corresponding to an external control instruction when the control instruction is received.

The detection chip is configured to detect the inductive capacitance and the interelectrode capacitance, determine inductive capacitance variation corresponding to the inductive capacitance and interelectrode capacitance variation corresponding to the interelectrode capacitance, determine a control type corresponding to the control instruction according to the inductive capacitance variation and the interelectrode capacitance variation, and trigger the terminal device to perform a control operation corresponding to the control type.

In the terminal control system according to the embodiment of the present disclosure, the detection chip is connected to each terminal key, at least one terminal key is arranged on the side of the terminal device, and the detection chip is arranged at any place in the terminal device, which may be arranged close to the side arranged with the terminal key. When receives the external control instruction, the terminal key generates the inductive capacitance and the interelectrode capacitance corresponding to the control instruction. The detection chip detects the inductive capacitance and the interelectrode capacitance generated by the terminal key. According to a detection result, the detection chip determines the inductive capacitance variation corresponding to the inductive capacitance and the interelectrode capacitance variation corresponding to the interelectrode capacitance. Then, the control type corresponding to the control instruction is determined according to the inductive capacitance variation and the interelectrode capacitance variation, and the terminal device is triggered to execute the corresponding control operation according to the control type.

It should be noted that the control type includes user pressing control, user touch control, mechanical pressing control, and mechanical touch control.

By using the method provided by the embodiment of the present disclosure, the inductive capacitance and the interelectrode capacitance generated in the terminal key are detected by the detection chip. The control type corresponding to the control instruction is determined according to the inductive capacitance variation corresponding to the inductive capacitance and the interelectrode capacitance variation corresponding to the interelectrode capacitance, and the terminal device is triggered to perform the operation corresponding to the control type, thereby avoiding the terminal device performing misoperation when the control type is the mechanical pressing control or the mechanical touch control, and improving user experience.

Figure 2:
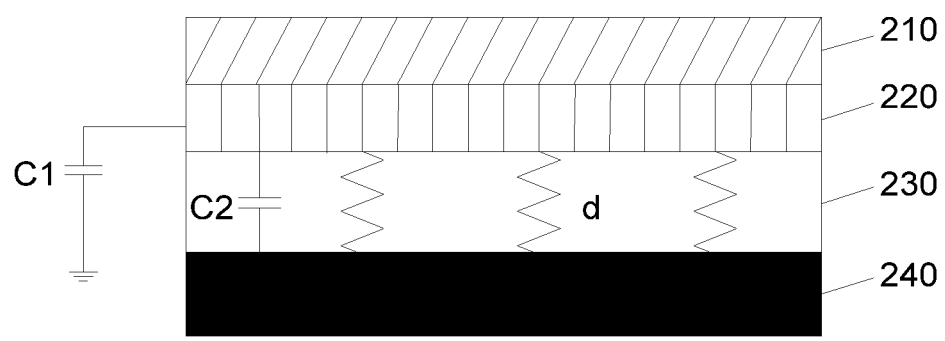
FIG. 2 is another system structure diagram of a terminal control system according to an embodiment of the present disclosure.

In the terminal control system provided by an embodiment of the present disclosure, an internal structure of the terminal key 200 in the above-mentioned system, as illustrated in FIG. 2, specifically includes:

a key shell 210, a capacitive sensing layer 220, a buffer layer 230 and a substrate 240, which are arranged in sequence.

The key shell is configured to protect the capacitive sensing layer, the buffer layer and the substrate.

One end of the capacitive sensing layer is connected to system ground, to form a ground capacitor to the system ground. The capacitive sensing layer is configured to generate the inductive capacitance corresponding to the control instruction, when the terminal key receives the control instruction.

The buffer layer is configured to form an interelectrode gap between the capacitive sensing layer and the substrate; and form a deformation when the capacitive sensing layer receives the control instruction, to generate interelectrode gap variation corresponding to the deformation.

The substrate is configured to form an interelectrode capacitor with the capacitance sensing layer, and generate the interelectrode capacitance corresponding to the control instruction after the buffer layer forms the deformation.

In the terminal control system provided by an embodiment of the present disclosure, in the internal structure of the terminal key as illustrated in FIG. 2, the key shell 210, the capacitive sensing layer 220, the buffer layer 230, and the substrate 240 are arranged in sequence. The key shell is a shell of the terminal key, which is used to protect the capacitive sensing layer, the buffer layer and the substrate. When receiving the external control instruction, the key shell drives the capacitive sensing layer to move downward, causing the buffer layer to deform. The capacitive sensing layer is located on a lower surface of the key shell. The capacitive sensing layer can be glued to the key shell through an adhesive. A ground capacitor C1 is formed between the capacitive sensing layer and the system ground. When the external control instruction is received, the capacitive sensing layer generates the inductive capacitance corresponding to the control instruction. The substrate is located on a lower side of the capacitance sensing layer and forms an interelectrode capacitor C2 with the capacitance sensing layer. When the buffer layer is deformed, the interelectrode capacitance corresponding to the control instruction is generated. The buffer layer is located between the capacitive sensing layer and the substrate, and can support the capacitive sensing layer to form the interelectrode gap d between the capacitive sensing layer and the substrate. When the control instruction is received, the deformation occurs, and the interelectrode gap variation corresponding to the deformation is generated, which results in a change in the interelectrode capacitor and generates the interelectrode capacitance corresponding to the control instruction.

It should be noted that the capacitive sensing layer generates the capacitive sensing only when the control instruction is received. When no control instruction is received, there is only the capacitance of the ground capacitor. When the control instruction is received, a control capacitor is formed between the capacitive sensing layer and a control object that performs the control operation, and the control capacitor is connected in parallel with the ground capacitor of the capacitive sensing layer. Therefore, the inductive capacitance generated by the capacitive sensing layer is a sum of a capacitance of the control capacitor and the capacitance of the ground capacitor. The control object can be a human body, a conductive or a non-conductive mechanical object.

It should also be noted that when no control instruction is received and the buffer layer is not deformed, a capacitance of the interelectrode capacitor between the capacitive sensing layer and the substrate is an initial capacitance. When the buffer layer is deformed, the initial capacitance increases, and the interelectrode capacitance corresponding to the control instruction is generated.

By applying the system provided by the embodiment of the present disclosure, according to the composition structure of the key shell, the capacitive sensing layer, the buffer layer and the substrate, the terminal key generates the inductive capacitance and the interelectrode capacitance corresponding to the control instruction in response to a reception of the control instruction, to determine the control type applied to the terminal key through detecting the inductive capacitance and the interelectrode capacitance by the detection chip, thereby effectively avoiding the misoperation of the terminal key due to accidental touch, and improving the user experience.

Figure 3:
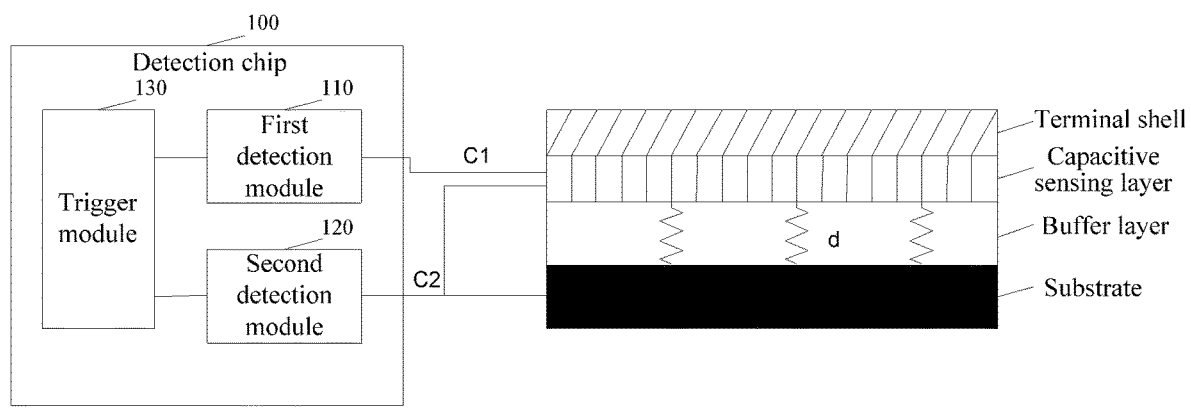
FIG. 3 is another system structure diagram of a terminal control system according to an embodiment of the present disclosure.

In the terminal control system according to an embodiment of the present disclosure, an internal structure of the detection chip 100 in the above-mentioned system, as illustrated in FIG. 3, specifically includes:

a first detection module 110, a second detection module 120, and a trigger module 130.

The first detection module is configured to detect the ground capacitor of the capacitance sensing layer; when the capacitance sensing layer generates the inductive capacitance, detect the inductive capacitance variation corresponding to the inductive capacitance; and determine whether the inductive capacitance variation is greater than a preset first threshold.

The second detection module is configured to detect the interelectrode capacitor between the capacitance sensing layer and the substrate; when the interelectrode capacitance greater than the initial capacitance is generated between the capacitance sensing layer and the substrate, detect the interelectrode capacitance variation corresponding to the interelectrode capacitance; and determine whether the interelectrode capacitance variation is greater than a preset second threshold.

The trigger module is configured to when the inductive capacitance variation is greater than the preset first threshold and the interelectrode capacitance variation is greater than the preset second threshold, determine that the control type corresponding to the control instruction is user pressing control, and trigger the terminal device to perform a pressing control operation corresponding to the user pressing control; when the inductive capacitance variation is not greater than the first threshold and the interelectrode capacitance variation is greater than the second threshold, determine that the control type corresponding to the control instruction is mechanical pressing control, and no trigger the terminal device to perform any control operation; when the inductive capacitance variation is greater than the first threshold and the interelectrode capacitance variation is not greater than the second threshold, determine that the control type corresponding to the control instruction is user touch control, and trigger the terminal device to perform a touch control operation corresponding to the user touch control; and when the inductive capacitance variation is not greater than the first threshold and the interelectrode capacitance variation is not greater than the second threshold, determine that the control type corresponding to the control instruction is mechanical touch control, and no trigger the terminal device to perform any control operation.

In the terminal control system according to an embodiment of the present disclosure, the detection chip illustrated in FIG. 3 specifically includes the first detection module, the second detection module, and the trigger module. The first detection module is connected to the capacitance sensing layer in the terminal key, and is configured to detect the capacitance C1 of the ground capacitor of the capacitance sensing layer. When the terminal key receives the external control instruction, the capacitive sensing layer generates the inductive capacitance C1'. The first detection module detects the inductive capacitance C1', and determines the inductive capacitance variation ΔC1 of the capacitance sensing layer according to the inductive capacitance, where ΔC1=C1'−C1. In addition, the first detection module determines whether the inductive capacitance variation is greater than the preset first threshold. The first threshold can be set according to a difference between a dielectric constant of a human body of the user and a dielectric constant of a mechanical device. Since the dielectric constant of the human body is much greater than the dielectric constant of the mechanical device, the difference between the dielectric constants is used as the first threshold to distinguish whether the terminal key is controlled by the user or touched by the machine accidentally.

The second detection module is connected to the capacitance sensing layer and the substrate in the terminal key respectively, and is configured to detect an initial capacitance C2 of the interelectrode capacitor between the capacitance sensing layer and the substrate. When the buffer layer is deformed to decrease the interelectrode gap, the interelectrode capacitance increases. When the interelectrode capacitance corresponding to the deformation is generated, the second detection module detects the generated interelectrode capacitance C2' corresponding to the deformation, determines the interelectrode capacitance variation ΔC2, where, ΔC2=C2'−C2. The second detection module determines whether the interelectrode capacitance variation is greater than the preset second threshold. The second threshold is set according to the interelectrode gap. When the capacitance sensing layer is deformed, the interelectrode gap changes. According to a degree of the change of the interelectrode gap, it is determined whether the terminal key is under touch control or pressing control. When the terminal key is under pressing control, the capacitive sensing layer deforms significantly, the interelectrode gap becomes smaller, and the interelectrode capacitance becomes larger. When the terminal key is under touch control, the capacitance sensing layer deforms insignificantly, the interelectrode gap is basically unchanged, and a change of the interelectrode capacitance is not obvious. Therefore, when the interelectrode gap becomes smaller to a certain extent, the interelectrode capacitance increases significantly, so the interelectrode capacitance variation is also greater than the second threshold.

The trigger module is connected to the first detection module and the second detection module respectively. After the first detection module and the second detection module determine the inductive capacitance variation and the interelectrode capacitance variation, the trigger module triggers the terminal device to execute the corresponding control operation according to the inductive capacitance variation and the interelectrode capacitance variation. When the inductive capacitance variation is greater than the preset first threshold, that is $\Delta C1 > \Delta C_a$, and the interelectrode capacitance variation is greater than the preset second threshold, that is $\Delta C2 > \Delta C_b$, the control type corresponding to the control instruction is determined as user pressing control, and the trigger module in the detection chip triggers the terminal device to perform a pressing control operation corresponding to the user pressing control. When the inductive capacitance variation is not greater than the preset first threshold, that is $\Delta C1 \leq \Delta C_a$, and the interelectrode capacitance variation is greater than the preset second threshold, that is $\Delta C2 > \Delta C_b$, the control type corresponding to the control instruction is determined as mechanical pressing control, and the trigger module does not trigger the terminal device to perform any control operation. When the inductive capacitance variation is greater than the preset first threshold, that is $\Delta C1 > \Delta C_a$, and the interelectrode capacitance variation is not greater than the preset second threshold, that is $\Delta C2 \leq \Delta C_b$, the control type corresponding to the control instruction is determined as user touch control, and the trigger module triggers the terminal device to perform a touch control operation corresponding to the user touch control. When the inductive capacitance variation is not greater than the preset first threshold, that is, $\Delta C1 \leq \Delta C_a$, and the interelectrode capacitance variation is not greater than the preset second threshold, that is $\Delta C2 \leq \Delta C_b$, the control type corresponding to the control instruction is determined as mechanical touch control, and the trigger module does not trigger the terminal device to perform any control operation.

In an embodiment, the second detection module can be configured to detect a pressure value of the terminal key in addition to the interelectrode capacitance. When the terminal key receives the external control instruction, the control instruction is determined as the pressing control by detecting a variation of the pressure value received by the capacitance sensing layer and the substrate in the terminal key. When the variation of the pressure value is greater than a preset pressure threshold, it is determined that the terminal key is under pressing control. In combination with the determination of the inductive capacitance variation, it is determined whether the control type of the control instruction received by the terminal key is the user pressing control or the mechanical pressing control.

In the terminal control system according to the embodiment of the present disclosure, when the first detection module, the second detection module and the trigger module in the detection chip detect that the terminal key receives the control instruction, the control type corresponding to the control instruction is determined, and the terminal device is triggered to perform the control operation corresponding to the control type, so as to prevent the terminal device from performing misoperation due to the control instruction of the terminal key, and improve the user experience.

In the terminal control system according to the embodiment of the present disclosure, when the detection chip is connected to the terminal key, the inductive capacitance and the interelectrode capacitance in the terminal key can be detected in real time, and the control type of the terminal key can be determined according to the inductive capacitance variation and the interelectrode capacitance variation, so that the detection chip triggers the terminal device to perform the corresponding control operation. In order to enrich functions implemented by the terminal key, the terminal control system according to an embodiment of the present disclosure may further includes:

an orientation sensor.

The orientation sensor is connected to the detection chip.

The orientation sensor is configured to sense a screen orientation of the terminal device, and send an orientation change instruction to the detection chip when the screen orientation of the terminal device changes. The detection chip switches a key function of the terminal key corresponding to the control operation according to the orientation change instruction.

In the terminal control system according to an embodiment of the present disclosure, the orientation sensor is a sensor for detecting the screen orientation of the terminal device. The orientation sensor is connected to the detection chip and is arranged at any place inside the terminal device. The orientation sensor can be arranged on a side close to the detection chip. The orientation sensor is configured to sense the screen orientation of the terminal device. When the screen orientation of the terminal device changes, for example, when the screen orientation of the terminal device switches from an original vertical screen to a horizontal screen, the orientation sensor sends the changing instruction to the detection chip according to the changed orientation of the terminal screen. After the detection chip receives the orientation changing instruction sent by the orientation sensor, the key function of the terminal key is switched. The terminal key receives the external control instruction when the screen orientation of the terminal device is changed, and the detection chip detects the control type corresponding to the control instruction. In this case, the detection chip can trigger the terminal device to execute the key function corresponding to the control operation, based on the key function of the terminal key.

The system provided by the embodiment of the present disclosure can be applied to a variety of terminal devices, such as a smart phone and a tablet computer. When the terminal device is the smart phone, a following example is given.

A first key is set on one side of the smart phone. When the user uses the smart phone to listen to music, the first key is configured to increase volume of the smart phone and turn a page up in a vertical screen state. When the user presses the first key, the volume can be increased, and when the user touches and slides the first key, the page can be turned up. When the first key of the smart phone receives the external control instruction in the vertical screen state, a capacitance sensing layer in the first key generates an inductive capacitance, and interelectrode capacitance is generated between a substrate and the capacitance sensing layer. A detection chip inside the smart phone detects the inductive capacitance and the interelectrode capacitance, and determines an inductive capacitance variation and an interelectrode capacitance variation. When the inductive capacitance variation is greater than the preset first threshold, and the interelectrode capacitance variation is greater than the preset second threshold, the detection chip determines that the control type corresponding to the control instruction is the user pressing control, and triggers the smart phone to increase the volume according to the user pressing control. When the user switches the screen state of the smart phone and uses the smart phone to play a shooting game, the orientation sensor determines the screen orientation of the smart phone and sends the orientation changing instruction to the detection chip. The detection chip switches a key function of the first key after receiving the orientation changing instruction sent by the orientation sensor. For example, the first key is configured to realize a moving forward function and a function of aiming down the sight in the shooting game in a horizontal screen state. If the user presses the first key, a character in the game can move forward. When the user touches and slides the first key, the character can aim down the sight. When the first key of the smart phone receives the external control instruction in the horizontal screen state, it generates the inductive capacitance and the interelectrode capacitance, and the detection chip inside the smart phone detects the inductive capacitance and the interelectrode capacitance to determine the inductive capacitance variation and the interelectrode capacitance variation. When the inductive capacitance variation is not greater than the first threshold and the interelectrode capacitance variation is greater than the second threshold, the detection chip determines that the control type corresponding to the control instruction is mechanical pressing control, and the detection chip does not trigger the smart phone to perform the function of aiming down the sight in the shooting game.

It should be noted that the orientation sensor may be a gravity acceleration sensor Gsensor, a gyroscope, or other sensor that can sense changes in the orientation of the terminal screen.

In an embodiment, when the orientation sensor detects that the screen orientation of the terminal device is changed, it may also send the orientation changing instruction to the detection chip to make the detection chip turn off some functions of the terminal key.

In the system provided by an embodiment of the present disclosure, the detection chip can be connected with the orientation sensor, to enrich the functions of the terminal key and improve the user experience.

In the terminal control system according to an embodiment of the present disclosure, the key shell of each terminal key is arranged on a side surface of the terminal control system.

The capacitance sensing layer, the buffer layer and the substrate of each terminal key are arranged inside the terminal control system.

Respective key shells are arranged on the side surface of the terminal control system according to a preset arrangement.

In the system provided by the embodiment of the present disclosure, at least one terminal key may be provided on the side of the terminal control system, and the key shell of the terminal key may be provided on the side surface. The capacitance sensing layer, the buffer layer and the substrate of each terminal key are arranged inside the terminal control system. The key shell of each key is arranged on the side surface of the terminal control system according to the preset arrangement. For example, the terminal keys set on one side of the terminal control system can all implement pressing control operations, and terminal keys set on the other side can implement touch control operations. Alternatively, the terminal keys set on one side of the system for terminal control can realize pressing control operations and touch control operations, and no terminal key is set on the other side.

Figure 4:
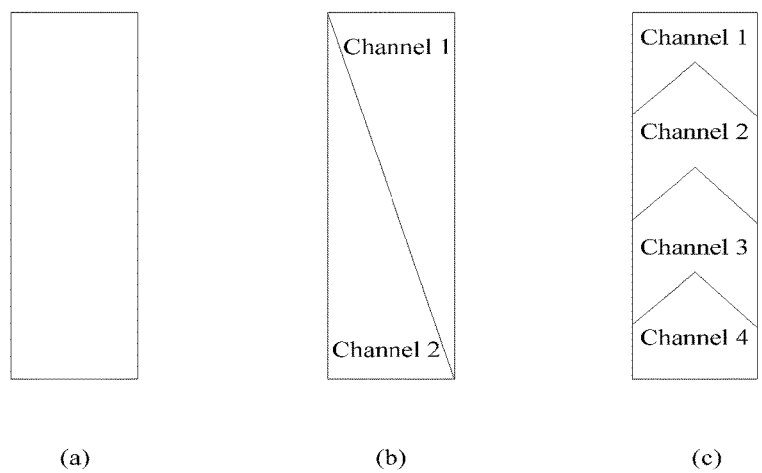
FIG. 4 is another system structure diagram of a terminal control system according to an embodiment of the present disclosure.

In the terminal control system according to an embodiment of the present disclosure, the capacitive sensing layer may have a single strip structure, or a sliding strip structure containing at least two channels. Details are illustrated in FIG. 4. Figure (a) in FIG. 4 is the single strip structure. In the case of the single strip structure, the capacitive sensing layer is mainly used to realize a pressing function of the terminal key. The user can press the terminal key to realize the key function of the terminal key. As illustrated in Figures (b) and (c) in FIG. 4, Figure (b) is a sliding strip structure with two channels, and Figure (c) is a sliding strip structure with four channels. In the case of the sliding strip structure having at least two channels, the capacitive sensing layer can be used to realize the function of pressing or touch control operation of the terminal key. The user can press the terminal key or touch and slide the terminal key to realize the function of pressing or touch control operation of the terminal key. When the capacitive sensing layer has the sliding strip structure, a capacitor may be provided on each channel to sense a speed of the user sliding the terminal key in a sliding operation process of the user touching the terminal key. It can be determined whether the user control type is pressing, tapping or sliding touch according to the speed of the user sliding the terminal key on the capacitive sensing layer, so as to realize different control operations according to different control types. The more channels on the capacitive sensing layer, the more capacitors are installed, and the more sensitive the sense for the speed of the user sliding the terminal key. The buffer layer is located between the capacitive sensing layer and the substrate, and the buffer layer may be an air gap layer that supports the capacitive sensing layer and is composed of an elastic structure material such as foam or springs. The substrate can be a grounded metal inside the terminal device.

By using the system according to the embodiment of the present disclosure, the arrangement of the key shell, the capacitive sensing layer, the buffer layer and the substrate of the terminal key can make the user operate more conveniently and improve the user experience.

Figure 5:
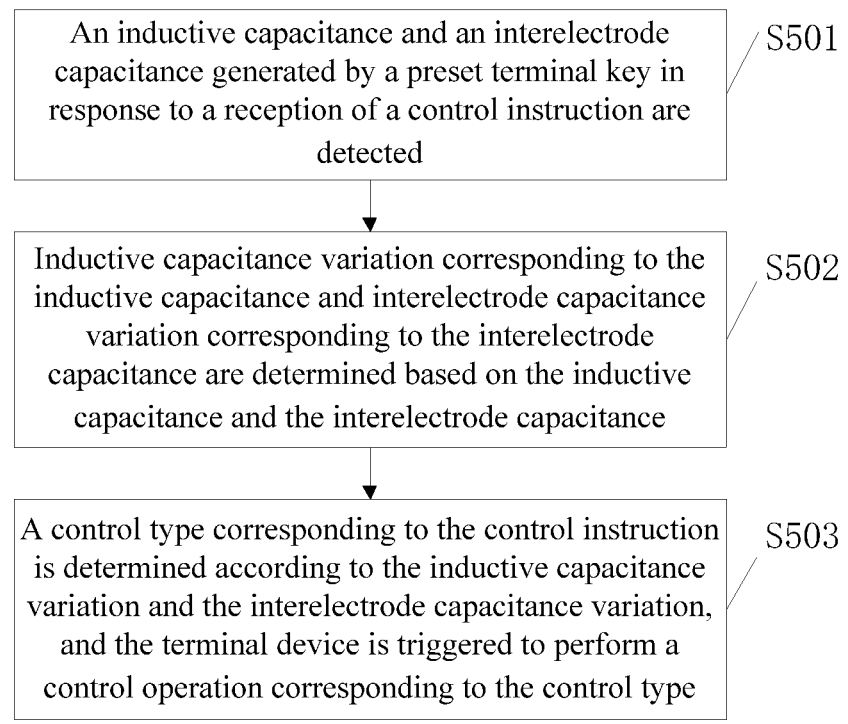
FIG. 5 is a method flow chart of a terminal control method according to an embodiment of the present disclosure.

Corresponding to the system described in FIG. 1, a terminal control method is provided according to an embodiment of the present disclosure, to implement respective system structures in the terminal control system. The terminal control method according to an embodiment of the present disclosure can be applied to a computer terminal or various mobile devices, an execution body of the method may be a detection chip. A method flow chart of this method is illustrated in FIG. 5, which specifically includes steps S501 to S503.

In step S501, an inductive capacitance and an interelectrode capacitance generated by a preset terminal key in response to a reception of a control instruction are detected.

In the method provided by an embodiment of the present disclosure, the detection chip detects the capacitances generated by the terminal key in real time. When receiving the control instruction, the terminal key generates the inductive capacitance and the interelectrode capacitance corresponding to the control instruction. The detection chip detects the inductive capacitance and the interelectrode capacitance generated by the terminal key.

In step S502, inductive capacitance variation corresponding to the inductive capacitance and interelectrode capacitance variation corresponding to the interelectrode capacitance are determined based on the inductive capacitance and the interelectrode capacitance.

In the method provided by an embodiment of the present disclosure, when the detection chip detects the inductive capacitance and the interelectrode capacitance of the terminal key, the inductive capacitance variation and the interelectrode capacitance variation on the terminal key are determined according to the inductive capacitance and the interelectrode capacitance.

It should be noted that before receiving the control instruction, the detection chip intelligently detects a capacitance of a ground capacitor and an initial capacitance of the interelectrode capacitor in the terminal key. For example, when the terminal key does not receive the control instruction, the capacitance of the ground capacitor is $C1$ and the initial capacitance of the interelectrode capacitor is $C2$. After the control instruction is received, the inductive capacitance $C1'$ and the interelectrode capacitance $C2'$ corresponding to the control instruction are generated. Then, in the terminal key, the inductive capacitance variation is $\Delta C1=C1'-C1$, and the interelectrode capacitance variation is $\Delta C2=C2'-C2$.

In step S502, a control type corresponding to the control instruction is determined according to the inductive capacitance variation and the interelectrode capacitance variation, and the terminal device is triggered to perform a control operation corresponding to the control type.

In the method provided by an embodiment of the present disclosure, the control type corresponding to the received control instruction can be determined according to the inductive capacitance variation and the interelectrode capacitance variation. According to the control type, the detection chip triggers the terminal device to execute the control operation corresponding to the control type according to the key function of the terminal key.

It should be noted that the control type includes user control and mechanical control. The operations of a user touching, sliding or pressing the terminal key belong to user control; and operations, other than the operations of a user touching, sliding or pressing the terminal key, belong to mechanical control.

In the method provided by an embodiment of the present disclosure, when the terminal key receives the external control instruction, the detection chip detects the inductive capacitance $C1'$ and the interelectrode capacitance $C2'$ corresponding to the control instruction generated by the terminal key, and determines the inductive capacitance variation $\Delta C1$ according to the inductive capacitance and the interelectrode capacitance variation $\Delta C2$ according to the interelectrode capacitance. The detection chip determines the control type, which corresponds to the control instruction and is received by the terminal key, according to the inductive capacitance variation and the interelectrode capacitance variation. Then, the detection chip triggers the terminal device having the terminal key according to the control type so that the terminal device executes the control operation corresponding to the control type.

By using the method provided by the embodiment of the present disclosure, the control type of the control instruction is determined by calling the detection chip, so that the terminal device can execute the corresponding operation. In this way, misoperation is avoided and the user experience is improved.

In the method provided by an embodiment of the present disclosure, based on the above step S503, the determining the control type corresponding to the control instruction according to the inductive capacitance variation and the interelectrode capacitance variation, and triggering the terminal device to perform the control operation corresponding to the control type includes:

determining whether the inductive capacitance variation is greater than a preset first threshold;

when the inductive capacitance variation is greater than the first threshold, determining that the control type corresponding to the control instruction is user control, and triggering the terminal device to perform a control operation corresponding to the user control; and when the inductive capacitance variation is not greater than the first threshold, determining that the control type corresponding to the control instruction is mechanical control, and no triggering the terminal device to perform any control operation.

In the method provided by an embodiment of the present disclosure, it can be determined whether the control instruction is a control operation performed by the user or by the mechanical, by detecting the inductive capacitance variation. When the inductive capacitance variation is greater than the first threshold, the control operation is performed by the user, and the detection chip can trigger the terminal device to perform the corresponding control operation. If the inductive capacitance variation is not greater than the first threshold, the control operation is not performed by the user, and the detection chip does not trigger the terminal device to perform any operation.

The terminal control system provided by the embodiments of the present disclosure can be applied in various fields. For example, in a field of a smart phone, when a side key of the smart phone receives the external control instruction, the detection chip is called to detect the inductive capacitance in the side key of the smart phone. The detection chip determines whether the inductive capacitance variation is greater than a first capacitance threshold. When the inductive capacitance variation is greater than the first capacitance threshold, it is determined that the control type corresponding to the control instruction and received by the side key of the smart phone is user control. When the control type is determined to be user control, the smart phone can be triggered to execute a functional operation corresponding to a side key function, according to the side key function of the side key of the smart phone, thereby improving the user experience of using the side key of the smart phone.

By applying the method provided by the embodiment of the present disclosure, the detection chip determines whether the control type corresponding to the control instruction is user control. After the user control is determined, the terminal device is triggered to execute the control operation corresponding to the key function according to the key function, thereby improving the user experience.

In the method provided by an embodiment of the present disclosure, based on the above embodiment, the step of when the inductive capacitance variation is greater than the first threshold, determining that the control type corresponding to the control instruction is user control, and triggering the terminal device to perform the control operation corresponding to the user control specifically includes:

when the inductive capacitance variation is greater than the first threshold, detecting whether the interelectrode capacitance variation is greater than a preset second threshold;

when the interelectrode capacitance variation is greater than the second threshold, determining that the user control is a user pressing control, and triggering the terminal device to perform a pressing control operation corresponding to the user pressing control; and when the interelectrode capacitance variation is not greater than the second threshold, determining that the user control is a user touch control, and triggering the terminal device to perform a touch control operation corresponding to the user touch control.

In the method provided by an embodiment of the present disclosure, in order to further determine whether the user control is the user pressing control or the user touch control, the detection chip detects whether the interelectrode capacitance variation is greater than the second threshold. If the interelectrode capacitance variation is greater than the second threshold, the user control is the user pressing control; and if the interelectrode capacitance variation is not greater than the second threshold, the user control is the user touch control. In the case of the user pressing control, the terminal device is triggered to perform the touch control operation corresponding to the press control. In the case of the user touch operation, the terminal device is triggered to perform the touch control operation corresponding to the touch control. That is, when the terminal key receives a press or touch, different key functions can be performed.

By using the method provided by the embodiment of the present disclosure, the control type can be further determined, so that the terminal device can perform more accurate control operations, thereby improving the user experience.

Based on the above embodiments, on another aspect, the step of when the inductive capacitance variation is not greater than the first threshold, determining that the control type corresponding to the control instruction is mechanical control, and no triggering the terminal device to perform any control operation specifically includes:

when the inductive capacitance variation is not greater than the first threshold, detecting whether the interelectrode capacitance variation is greater than a preset second threshold;

when the interelectrode capacitance variation is greater than the second threshold, determining that the mechanical control is mechanical pressing control, and no triggering the terminal device to perform any control operation; and when the interelectrode capacitance variation is not greater than the second threshold, determining that the mechanical control is mechanical touch control, and no trigging the terminal device to perform any control operation.

In the method provided by the embodiment of the present disclosure, after the control type is determined to be a mechanical control, it may be further determined whether the control type is mechanical pressing control or mechanical touch control. When it is detected that the interelectrode capacitance variation is greater than the second threshold, the mechanical control is determined to be the mechanical pressing control. If the interelectrode capacitance variation is not greater than the second threshold, the mechanical control is determined to be the mechanical touch control. However, for both a mechanical press operation and a mechanical touch operation, the terminal device is not triggered to perform any operation.

By using the method provided by the embodiment of the present disclosure, when the control type is mechanical pressing control or mechanical touch control, the terminal device is not triggered to perform any control operation, thereby preventing misoperation due to mechanical touch and improving the user experience.

Figure 6:
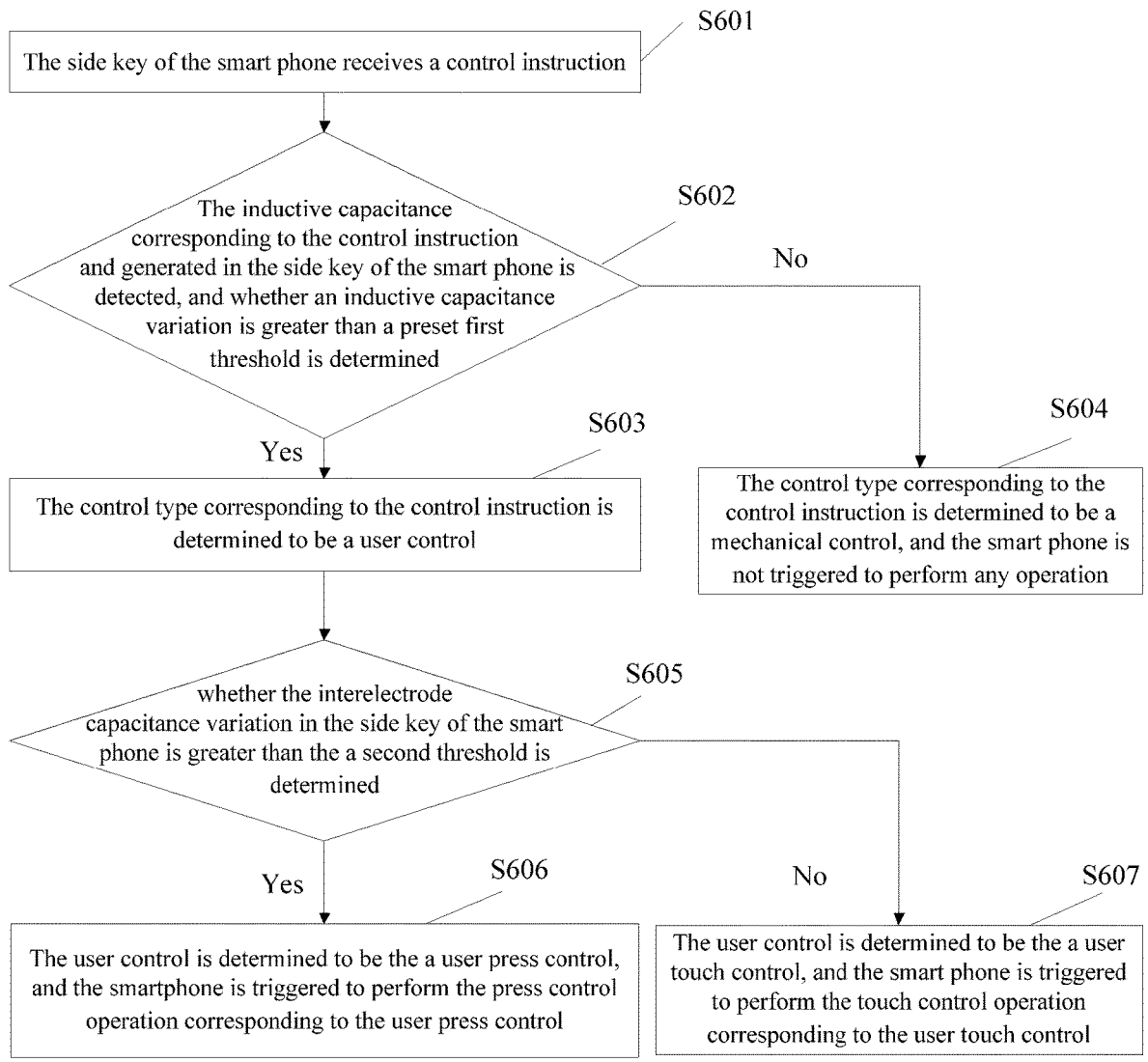
FIG. 6 is a method schematic diagram of a terminal control method according to an embodiment of the present disclosure.

Based on the method provided by the foregoing embodiments, a following specific implementation embodiment is described. An implementation method of the embodiment is applied to a side key of a smart phone. As illustrated in FIG. 6 specifically, the method includes steps S601 to S607.

In step S601, the side key of the smart phone receives a control instruction.

In step S602, the detection chip set inside the smart phone detects the inductive capacitance which corresponds to the control instruction and is generated in the side key of the smart phone, and determines whether an inductive capacitance variation is greater than a preset first threshold.

In step S603: when the inductive capacitance variation is greater than the first threshold, the control type corresponding to the control instruction is determined to be a user control, and step S605 is executed.

In step S604: When the inductive capacitance variation is not greater than the first threshold, the control type corresponding to the control instruction is determined to be a mechanical control, and the smart phone is not triggered to perform any operation.

In step S605: when the control type corresponding to the control instruction is determined to be the user control, whether the interelectrode capacitance variation in the side key of the smart phone is greater than a preset second threshold is determined.

In step S606: when the interelectrode capacitance variation is greater than the second threshold, the user control is determined to be a user press control, and the smartphone is triggered to perform the press control operation corresponding to the user press control.

In step S607: when the interelectrode capacitance variation is not greater than the second threshold, the user control is determined to be a user touch control, and the smart phone is triggered to perform the touch control operation corresponding to the user touch control.

In an embodiment, it may be determined whether the interelectrode capacitance variation is greater than the second threshold firstly. After determining whether the control type corresponding to the control instruction is press control or touch control, it is determined whether the inductive capacitance variation is greater than the first threshold. Then, whether the control type of the control instruction is user control or mechanical control is determined.

In the method provided by an embodiment of the present disclosure, in addition to detecting the capacitance variation of the terminal key, the detection chip can also determine an orientation changing of the screen of the terminal device by the orientation sensor, so as to switch the key function of the terminal key. The method specifically further includes:

switching a key function of the terminal key corresponding to the control operation according to an orientation changing instruction, in response to a reception of the orientation changing instruction sent by a preset orientation sensor; and when the control type corresponding to the control instruction received by the terminal key is determined to be a user control, triggering the terminal device to perform a control operation corresponding to the key function.

In the method provided by an embodiment of the present disclosure, when sensing that the orientation changing of the screen of the terminal device, the orientation sensor sends the orientation changing instruction to the detection chip to notify the detection chip of the screen orientation changing. After receiving the orientation changing instruction, the detection chip switches the key function of the terminal key. For example, an original key function of the terminal device is to increase volume. After receiving the orientation changing instruction, the key function is switched to page turning. When the terminal key receives the control instruction, if the control instruction detected by the detection chip is the user control instruction, the detection chip triggers the terminal device to execute the control operation corresponding to the control instruction according to the switched key function.

In an embodiment, after the detection chip receives the orientation changing instruction, the key function of the terminal key can also be turned off.

By applying the method provided by the embodiment of the present disclosure, functions of the terminal key can be enriched, thereby meeting the user demands in different scenarios, and improving the user experience.

A terminal device is further provided according to an embodiment of the present disclosure. The terminal device includes the above terminal control system.

A terminal device is further provided according to an embodiment of the present disclosure. The terminal device includes the detection chip, the detection chip is configured to execute the above terminal control method.

Specifically, the terminal device may be a smart phone.

Specific implementation manners mentioned above and derivative processes of each implementation manner are all within the protection scope of the present disclosure.

The above embodiments in this specification are described in a progressive manner. Each of the embodiments is mainly focused on describing its differences from other embodiments, and references may be made among these embodiments with respect to the same or similar portions among these embodiments. Specifically, for the system or embodiments of the system, since embodiments are similar to method embodiments, the description thereof is relatively simple, and reference may be made to the description of the method embodiments for relevant parts. The system and system embodiments described above are merely illustrative, where the units described as separate components may or may not be physically separate, and the components displayed as units may or may not be physical units, that is, they can be located in one place, or they can be distributed to multiple network units. Some or all of the modules may be selected according to actual needs to achieve the objectives of the solutions of the embodiments. Those ordinary skilled in the art can understand and implement without creative work.

Persons skilled in the art may further realize that, in combination with the embodiments herein, units and algorithm, steps of each example described can be implemented with electronic hardware, computer software, or the combination thereof. In order to clearly describe the interchangeability between the hardware and the software, compositions and steps of each example have been generally described according to functions in the foregoing descriptions. Whether the functions are executed in a mode of hardware or software depends on particular applications and design constraint conditions of the technical solutions. Persons skilled in the art can use different methods to implement the described functions for each particular application, but it should not be considered that the implementation goes beyond the scope of the embodiments of the present disclosure.

Based on the above description of the disclosed embodiments, those skilled in the art are capable of carrying out or using the present application. It is obvious for those skilled in the art to make many modifications to these embodiments. The general principle defined herein may be applied to other embodiments without departing from the spirit or scope of the present application. Therefore, the present application is not limited to the embodiments illustrated herein, but should be defined by the broadest scope consistent with the principle and novel features disclosed herein.

The invention claimed is:

1. A terminal control system, comprising:
a detection chip, and at least one terminal key arranged on a side of a terminal device, wherein
the detection chip is connected to each of the at least one terminal key;
each of the at least one terminal key is configured to generate an inductive capacitance and an interelectrode capacitance corresponding to an external control instruction, in response to a reception of the external control instruction; and the detection chip is configured to detect the inductive capacitance and the interelectrode capacitance; determine inductive capacitance variation corresponding to the inductive capacitance and interelectrode capacitance variation corresponding to the interelectrode capacitance; determine a control type corresponding to the control instruction according to the inductive capacitance variation and the interelectrode capacitance variation; and trigger the terminal device to perform a control operation corresponding to the control type;

wherein the detection chip comprises a trigger module, the trigger module is configured to:

in a case that the inductive capacitance variation is greater than a preset first threshold and the interelectrode capacitance variation is greater than a preset second threshold, determine that the control type corresponding to the control instruction is a user pressing control, and trigger the terminal device to perform a pressing control operation corresponding to the user pressing control; in a case that the inductive capacitance variation is not greater than the first threshold and the interelectrode capacitance variation is greater than the second threshold, determine that the control type corresponding to the control instruction is a mechanical pressing control, and no trigger the terminal device to perform any control operation; in a case that the inductive capacitance variation is greater than the first threshold and the interelectrode capacitance variation is not greater than the second threshold, determine that the control type corresponding to the control instruction is a user touch control, and trigger the terminal device to perform a touch control operation corresponding to the user touch control; and in a case that the inductive capacitance variation is not greater than the first threshold and the interelectrode capacitance variation is not greater than the second threshold, determine that the control type corresponding to the control instruction is a mechanical touch control, and no trigger the terminal device to perform any control operation.

2. The terminal control system according to claim 1, wherein the terminal key comprises:

a key shell, a capacitive sensing layer, a buffer layer and a substrate which are arranged in sequence, wherein the key shell is configured to protect the capacitive sensing layer, the buffer layer and the substrate;

one end of the capacitive sensing layer is connected to system ground to forms a ground capacitor to the system ground, the capacitive sensing layer is configured to generate the inductive capacitance corresponding to the control instruction in response to a reception of the control instruction by the terminal key;

the buffer layer is configured to form an interelectrode gap between the capacitive sensing layer and the substrate; and form a deformation in response to a reception of the control instruction by the capacitive sensing layer, to generate interelectrode gap variation corresponding to the deformation; and the substrate is configured to form an interelectrode capacitor with the capacitive sensing layer, and generate the interelectrode capacitance corresponding to the control instruction after the buffer layer forms the deformation.

3. The terminal control system according to claim 2, wherein the detection chip further comprises:

a first detection module, and a second detection module, wherein the first detection module is connected to the capacitive sensing layer;

the second detection module is connected to the capacitive sensing layer and the substrate respectively;

the trigger module is connected to the first detection module and the second detection module respectively;

the first detection module is configured to detect the ground capacitor of the capacitive sensing layer, detect the inductive capacitance variation corresponding to the inductive capacitance in response to a generation of the inductive capacitance by the capacitive sensing layer, and determine whether the inductive capacitance variation is greater than the preset first threshold;

the second detection module is configured to detect the interelectrode capacitor between the capacitive sensing layer and the substrate; in a case that the interelectrode capacitance greater than an initial capacitance is generated between the capacitive sensing layer and the substrate, detect the interelectrode capacitance variation corresponding to the interelectrode capacitance; and determine whether the interelectrode capacitance variation is greater than the preset second threshold.

4. The terminal control system according to claim 3, wherein the second detection module is further configured to:

detect a variation of a pressure value sustained by the terminal device in response to a reception of the control instruction by the terminal key, to determine whether the control instruction is a pressing control based on the variation of the pressure value, wherein the pressing control comprises the user pressing control and the mechanical pressing control.

5. The terminal control system according to claim 2, wherein the capacitive sensing layer has a single strip structure, or a sliding strip structure containing at least two channels.

6. The terminal control system according to claim 1, further comprising: an orientation sensor, wherein the orientation sensor is connected to the detection chip;

the orientation sensor is configured to sense a screen orientation of the terminal device, and send an orientation changing instruction to the detection chip in response to a change of the screen orientation of the terminal device, wherein the detection chip switches a key function of the terminal key corresponding to the control operation according to the orientation changing instruction.

7. The terminal control system according to claim 1, the key shell of each of the at least one terminal key is arranged on a side surface of the terminal control system;

the capacitive sensing layer, the buffer layer and the substrate of each of the at least one terminal key are arranged inside the terminal control system; and each key shell is arranged on the side surface of the terminal control system according to a preset arrangement.

8. A terminal device, comprising the terminal control system according to claim 1.

9. The terminal device according to claim 8, wherein the terminal device is a smart phone.

10. A terminal control method, comprising: detecting an inductive capacitance and an interelectrode capacitance which correspond to a control instruction and are generated by a preset terminal key, in response to a reception of the control instruction;

determining inductive capacitance variation corresponding to the inductive capacitance and interelectrode capacitance variation corresponding to the interelectrode capacitance, based on the inductive capacitance and the interelectrode capacitance; and determining a control type corresponding to the control instruction according to the inductive capacitance variation and the interelectrode capacitance variation, and triggering the terminal device to perform a control operation corresponding to the control type;

wherein the determining the control type corresponding to the control instruction according to the inductive capacitance variation and the interelectrode capacitance variation, and triggering the terminal device to perform the control operation corresponding to the control type comprises:

determining whether the inductive capacitance variation is greater than a preset first threshold;

determining that the control type corresponding to the control instruction is a user control and triggering the terminal device to perform a control operation corresponding to the user control, in a case that the inductive capacitance variation is greater than the first threshold; and determining that the control type corresponding to the control instruction is a mechanical control and no triggering the terminal device to perform any control operation, in a case that the inductive capacitance variation is not greater than the first threshold.

11. The terminal control method according to claim 10, wherein the determining that the control type corresponding to the control instruction is a user control and triggering the terminal device to perform the control operation corresponding to the user control, in a case that the inductive capacitance variation is greater than the first threshold comprises:

detecting whether the interelectrode capacitance variation is greater than a preset second threshold, in the case that the inductive capacitance variation is greater than the first threshold;

determining that the user control is a user pressing control and triggering the terminal device to perform a pressing control operation corresponding to the user pressing control, in a case that the interelectrode capacitance variation is greater than the second threshold; and determining that the user control is a user touch control and triggering the terminal device to perform a touch control operation corresponding to the user touch control, in a case that the interelectrode capacitance variation is not greater than the second threshold.

12. The terminal control method according to claim 10, wherein the determining that the control type corresponding to the control instruction is a mechanical control and no triggering the terminal device to perform any control operation, in a case that the inductive capacitance variation is not greater than the first threshold comprises:

detecting whether the interelectrode capacitance variation is greater than a preset second threshold, in the case that the inductive capacitance variation is not greater than the first threshold;

determining that the mechanical control is a mechanical pressing control and no triggering the terminal device to perform any control operation, in a case that the interelectrode capacitance variation is greater than the second threshold; and determining that the mechanical control is a mechanical touch control and no trigging the terminal device to perform any control operation, in a case that the interelectrode capacitance variation is not greater than the second threshold.

13. The terminal control method according to claim 10, further comprising:

switching a key function of the terminal key corresponding to the control operation according to an orientation changing instruction, in response to a reception of the orientation changing instruction sent by a preset orientation sensor; and triggering the terminal device to perform a control operation corresponding to the key function, in a case that it is determined that the control type corresponding to the control instruction and received by the terminal key is the user control.

14. A terminal device, comprising a detection chip, wherein the detection chip is stored with computer programs, when the computer programs are executed, the detection chip executes a terminal control method to:

detect an inductive capacitance and an interelectrode capacitance which correspond to a control instruction and are generated by a preset terminal key, in response to a reception of the control instruction;

determine inductive capacitance variation corresponding to the inductive capacitance and interelectrode capacitance variation corresponding to the interelectrode capacitance, based on the inductive capacitance and the interelectrode capacitance; and determine a control type corresponding to the control instruction according to the inductive capacitance variation and the interelectrode capacitance variation, and trigger the terminal device to perform a control operation corresponding to the control type;

wherein when the computer programs are executed, the detection chip further executes a terminal control method to:

determine whether the inductive capacitance variation is greater than a preset first threshold;

determine that the control type corresponding to the control instruction is a user control and triggering the terminal device to perform a control operation corresponding to the user control, in a case that the inductive capacitance variation is greater than the first threshold; and determine that the control type corresponding to the control instruction is a mechanical control and no triggering the terminal device to perform any control operation, in a case that the inductive capacitance variation is not greater than the first threshold.

15. The terminal device according to claim 14, wherein the terminal device is a smart phone.

* * * * *